United States Patent
Zhang et al.

(10) Patent No.: US 9,530,844 B2
(45) Date of Patent: Dec. 27, 2016

(54) TRANSISTOR STRUCTURES HAVING REDUCED ELECTRICAL FIELD AT THE GATE OXIDE AND METHODS FOR MAKING SAME

(71) Applicant: Cree, Inc., Durham, NC (US)

(72) Inventors: Qingchun Zhang, Cary, NC (US); Brett Hull, Raleigh, NC (US)

(73) Assignee: Cree, Inc., Durham, NC (US)

( * ) Notice: Subject to any disclaimer, the term of this patent is extended or adjusted under 35 U.S.C. 154(b) by 79 days.

(21) Appl. No.: 13/730,133

(22) Filed: Dec. 28, 2012

(65) Prior Publication Data

US 2014/0183553 A1 Jul. 3, 2014

(51) Int. Cl.
| | |
|---|---|
| *H01L 29/732* | (2006.01) |
| *H01L 29/66* | (2006.01) |
| *H01L 29/16* | (2006.01) |
| *H01L 29/739* | (2006.01) |
| *H01L 29/749* | (2006.01) |
| *H01L 29/78* | (2006.01) |
| *H01L 29/06* | (2006.01) |
| *H01L 29/08* | (2006.01) |

(52) U.S. Cl.
CPC ....... *H01L 29/1608* (2013.01); *H01L 29/0619* (2013.01); *H01L 29/0623* (2013.01); *H01L 29/66068* (2013.01); *H01L 29/66333* (2013.01); *H01L 29/66378* (2013.01); *H01L 29/66666* (2013.01); *H01L 29/66712* (2013.01); *H01L 29/7395* (2013.01); *H01L 29/749* (2013.01); *H01L 29/7802* (2013.01); *H01L 29/7828* (2013.01); *H01L 29/0847* (2013.01); *H01L 29/0878* (2013.01)

(58) Field of Classification Search
CPC ............. H01L 29/1608; H01L 29/7802; H01L 29/66712
USPC ........................................................... 257/77
See application file for complete search history.

(56) References Cited

U.S. PATENT DOCUMENTS

| | | |
|---|---|---|
| 4,803,533 A | 2/1989 | Chang et al. |
| 5,661,314 A | 8/1997 | Merrill et al. |
| 5,665,987 A | 9/1997 | Muraoka et al. |
| 5,783,474 A | 7/1998 | Ajit |

(Continued)

FOREIGN PATENT DOCUMENTS

| | | |
|---|---|---|
| EP | 1143526 A2 | 10/2001 |
| EP | 1429392 A2 * | 6/2004 |

(Continued)

OTHER PUBLICATIONS

International Search Report and Written Opinion for International Application PCT/US2013/073092 mailed Feb. 17, 2014, 14 pages.

(Continued)

*Primary Examiner* — Andy Huynh
*Assistant Examiner* — Sitaramarao S Yechuri
(74) *Attorney, Agent, or Firm* — Anthony J. Josephson

(57) ABSTRACT

A transistor device having reduced electrical field at the gate oxide interface is disclosed. In one embodiment, the transistor device comprises a gate, a source, and a drain, wherein the gate is at least partially in contact with a gate oxide. The transistor device has a P+ region within a JFET region of the transistor device in order to reduce an electrical field on the gate oxide.

23 Claims, 8 Drawing Sheets

(56) References Cited

U.S. PATENT DOCUMENTS

| | | | |
|---|---|---|---|
| 5,844,259 A * | 12/1998 | Kinzer et al. | 257/147 |
| 5,915,179 A * | 6/1999 | Etou et al. | 438/268 |
| 6,031,265 A | 2/2000 | Hshieh | |
| 6,169,300 B1 * | 1/2001 | Fragapane | 257/146 |
| 6,184,555 B1 * | 2/2001 | Tihanyi et al. | 257/342 |
| 6,198,129 B1 * | 3/2001 | Murakami | 257/339 |
| 6,573,534 B1 * | 6/2003 | Kumar | H01L 29/1608 257/328 |
| 6,847,091 B2 * | 1/2005 | Deboy et al. | 257/495 |
| 7,795,691 B2 | 9/2010 | Zhang et al. | |
| 7,989,882 B2 | 8/2011 | Zhang et al. | |
| 8,211,770 B2 | 7/2012 | Zhang et al. | |
| 8,232,558 B2 | 7/2012 | Zhang et al. | |
| 2003/0235942 A1 * | 12/2003 | Nakamura et al. | 438/138 |
| 2004/0119076 A1 | 6/2004 | Ryu | |
| 2006/0102908 A1 | 5/2006 | Imai et al. | |
| 2006/0267091 A1 | 11/2006 | Takahashi | |
| 2008/0296771 A1 | 12/2008 | Das et al. | |
| 2010/0100931 A1 | 4/2010 | Novack et al. | |
| 2010/0140628 A1 | 6/2010 | Zhang | |
| 2010/0295060 A1 * | 11/2010 | Kudou et al. | 257/77 |
| 2010/0301335 A1 | 12/2010 | Ryu et al. | |
| 2011/0057202 A1 | 3/2011 | Kono et al. | |
| 2011/0101375 A1 | 5/2011 | Zhang | |
| 2012/0292742 A1 | 11/2012 | Itoh et al. | |

FOREIGN PATENT DOCUMENTS

| | | |
|---|---|---|
| EP | 1737042 A1 | 12/2006 |
| EP | 1965432 A1 | 9/2008 |
| EP | 2068363 A2 | 6/2009 |
| GB | 2033658 A | 5/1980 |
| GB | 2243952 A | 11/1991 |
| JP | S60196975 A | 10/1985 |
| JP | H0778978 A | 3/1995 |

OTHER PUBLICATIONS

International Search Report and Written Opinion for International Application PCT/US2013/073093 mailed Apr. 1, 2014, 15 pages.
Non-Final Office Action for U.S. Appl. No. 13/730,068, mailed Feb. 6, 2015, 20 pages.
Non-Final Office Action for U.S. Appl. No. 14/259,821, mailed Mar. 24, 2015, 6 pages.
Tamaki, Tomohiro, et al., "Optimization of ON-State and Switching Performances for 15-20-kV 4H-SiC IGBTs," IEEE Transactions on Electron Devices, vol. 55, Issue 8, Aug. 2008, IEEE, pp. 1920-1927.
Advisory Action for U.S. Appl. No. 13/730,068, mailed Oct. 7, 2015, 4 pages.
Non-Final Office Action for U.S. Appl. No. 14/212,991, mailed Oct. 8, 2015, 22 pages.
Final Office Action for U.S. Appl. No. 14/259,821, mailed Aug. 24, 2015, 7 pages.
Advisory Action for U.S. Appl. No. 14/259,821, mailed Nov. 6, 2015, 3 pages.
International Search Report and Written Opinion for International Application PCT/US2015/011015, mailed Sep. 30, 2015, 15 pages.
International Preliminary Report on Patentability for PCT/US2013/073092, mailed Jul. 9, 2015, 9 pages.
International Preliminary Report on Patentability for PCT/US2013/073093, mailed Jul. 9, 2015, 11 pages.
Final Office Action for U.S. Appl. No. 13/730,068, mailed Jul. 22, 2015, 13 pages.
Non-Final Office Action for U.S. Appl. No. 14/259,821, mailed Jan. 7, 2016, 7 pages.
Examiner's Answer for U.S. Appl. No. 13/730,068, mailed May 26, 2016, 8 pages.
Non-Final Office Action for U.S. Appl. No. 14/212,991, mailed May 6, 2016, 16 pages.
Notice of Preliminary Rejection for Korean Patent Application No. 10-2015-7020113, mailed Jun. 27, 2016, 24 pages.
International Preliminary Report on Patentability for International Patent Application No. PCT/US2015/011015, mailed Sep. 22, 2016, 11 pages.

* cited by examiner

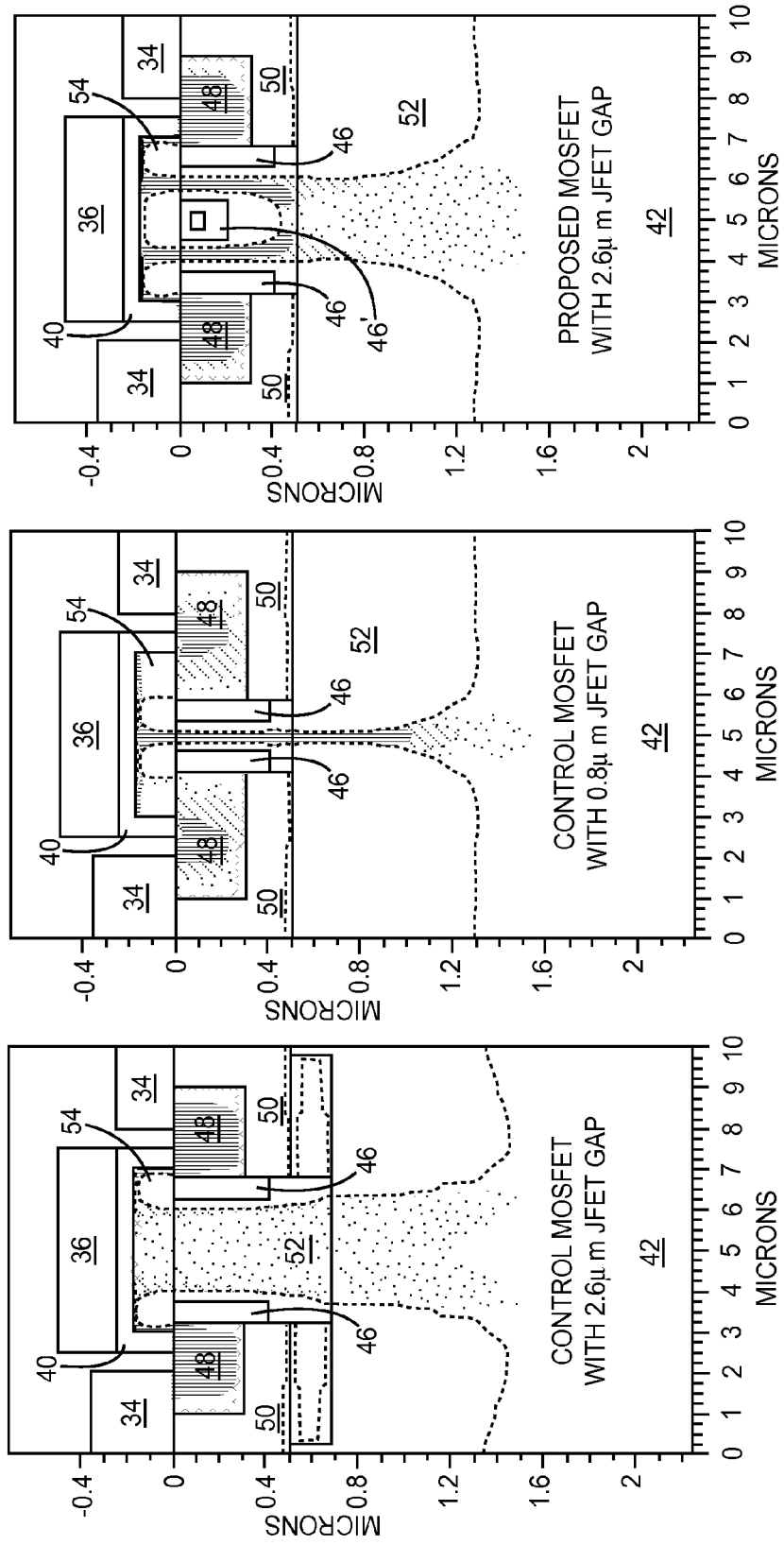

TRANSISTOR STRUCTURES HAVING REDUCED ELECTRICAL FIELD AT THE GATE OXIDE AND METHODS FOR MAKING SAME

FIELD OF THE DISCLOSURE

The present disclosure relates to transistor structures, and in particular, transistor structures such as metal-oxide-semiconductor field-effect transistors (MOSFETs) having a reduced electrical field at the gate oxide, and methods for making such transistor structures.

BACKGROUND

Metal-oxide-semiconductor field-effect transistors (MOSFETs) are well-known. In particular, power MOSFETs have been commercialized and are expected to be widely used in power systems. For traditional MOSFET structures, such as power MOSFETs on Silicon Carbide (SiC), one potential issue is the presence of a high electrical field at the gate oxide in the center of the junction field effect (JFET) region of the device. A JFET region generally is an active portion of an N-type drift layer which may include an N-type dopant and is located between two P-type wells. The JFET region may refer to a region in contact with channel regions coming up to the surfaces of the P-type wells by applying a gate voltage. The JFET region makes up a conduction path for electrons with the N+ source region, the channel region, the N-type drift region, the substrate, and the drain electrode. Under operation conditions at which a high bias is applied to the drain (close to the operational maximum) and in which the gate is held near ground potential, a high electrical field is created in the gate oxide that sits just above the JFET region. Imperfections in the interface material and gate oxide could result in a gate oxide failure during long-term blocking operation, in which the drain is placed under a high positive bias. Second, traditional MOSFETs also may suffer from possible hot carrier injection during long-term blocking operation, in which the drain is placed under a high positive bias.

SUMMARY

The present disclosure relates to a transistor device having reduced electrical field at the gate oxide interface, thus resulting in improved device reliability during long-term blocking operation, in which the drain is placed under a high positive bias, due to a lower gate oxide field, and resulting in a reduction of the possibility of hot carriers injecting into the gate oxide during long-term blocking operation, in which the drain is placed under a high positive bias. In one preferred embodiment, the transistor device is a MOSFET device and even more preferably a Silicon Carbide (SiC) MOSFET device. However, the transistor device may more generally be any type of device having a transistor (e.g., a power MOSFET; a double implanted field effect transistor (DIMOSFET); an insulated gate bipolar transistor (IGBT); and the like).

In one embodiment, a transistor device having a reduced electrical field at the gate oxide is disclosed. The transistor device comprises a gate, a source, and a drain, wherein the gate is at least partially atop a gate oxide layer. The transistor device has a P+ region within a JFET region of the transistor device in order to reduce an electrical field on the gate oxide. The transistor device may reduce the electrical field at the gate oxide interface and significantly reduce or eliminate reliability issues or failures that may occur during long-term blocking operation, in which the drain is placed under a high positive bias.

In another embodiment, the transistor device has a gate, a source, and a drain and comprises a first epitaxial layer of a first conductivity type, a second epitaxial layer of a second conductivity type on the first epitaxial layer, and a buried channel layer adjacent a first surface of the transistor device. The buried channel layer extends across a portion of the second epitaxial layer and is at least partially covered with a gate oxide. The transistor device also includes a well region of the first conductivity type extending from the first epitaxial layer down into the body of the transistor device to a depth, a JFET region adjacent the well region, and a drift layer below the well region.

A separate region of the first conductivity type, which may be a P+ region in one embodiment, is introduced within the JFET region of the transistor device, in one embodiment, the P+ region is introduced substantially in the middle of the JFET region and is connected to a source, which effectively shields the electrical field from the drain side of the transistor device. The P+ region introduced within the JFET region may also be shallower than the P+ well regions, which also mitigates the current spreading resistance.

In another embodiment, a MOSFET is disclosed having a reduced electrical field at the gate oxide. The MOSFET has a gate, a source, and a drain, wherein the gate is at least partially in contact with a gate oxide layer. The MOSFET comprises a P+-epitaxial layer and an N+-type region on the P+-type epitaxial layer. The MOSFET also comprises a buried channel layer adjacent a first surface of the MOSFET, the buried channel layer extending across a portion of the N+-type region. The MOSFET also includes a P+-type well extending from the P+-type epitaxial layer down into the body of the MOSFET to a depth and a JFET region adjacent the P+ well. The MOSFET also comprises a P+ region within the JFET region in order to reduce an electrical field on the gate oxide.

Methods for forming devices having a reduced electrical field at the gate oxide are also disclosed. In one embodiment, a method of forming a transistor device is disclosed. The method comprises providing a source and a gate, wherein the gate is at least partially in contact with a gate oxide layer. The method also discloses providing a P+region within a JFET region adjacent the P+-type well region in order to reduce an electrical field on the gate oxide.

In another embodiment, a method of forming a transistor is disclosed that includes providing a drift layer on a substrate and implanting a well region on the drift layer. The method also comprises providing a first epitaxial layer such that the first epitaxial layer covers at least a portion of the well region, providing a second epitaxial layer on the first epitaxial layer, and providing a buried channel layer over a portion of the second epitaxial layer. A source and a gate are provided, wherein the gate is at least partially in contact with a gate oxide layer. The method also includes introducing a P+ region within a JFET region adjacent the well region.

In yet another embodiment, a method of forming a MOSFET is disclosed. The method comprises providing a P+-type epitaxial layer on a drift layer and providing an N+-type region on the P+-type epitaxial layer. A buried channel layer is provided adjacent a first surface of the MOSFET, the buried channel layer extending across a portion of the N+-type region. A P+-type well is formed that extends from the P+-type epitaxial layer down into the body of the MOSFET to a depth. A source and a gate are provided, wherein the gate is at least partially in contact with a gate oxide layer. The method also includes providing a P+ region within a JFET region adjacent the P+-type well region in order to reduce an electrical field on the gate oxide.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4A illustrates a forward current conduction distribution for a conventional MOSFET having a standard JFET gap of 2.6 microns;

FIG. 4B illustrates a forward current conduction distribution for a conventional MOSFET having a narrowed JFET gap of 0.8 microns;

FIG. 4C illustrates a forward current conduction distribution for a MOSFET having a P+ region introduced within the JFET region of the transistor device according to one embodiment and having a standard JFET gap of 2.6 microns;

Figure 6:
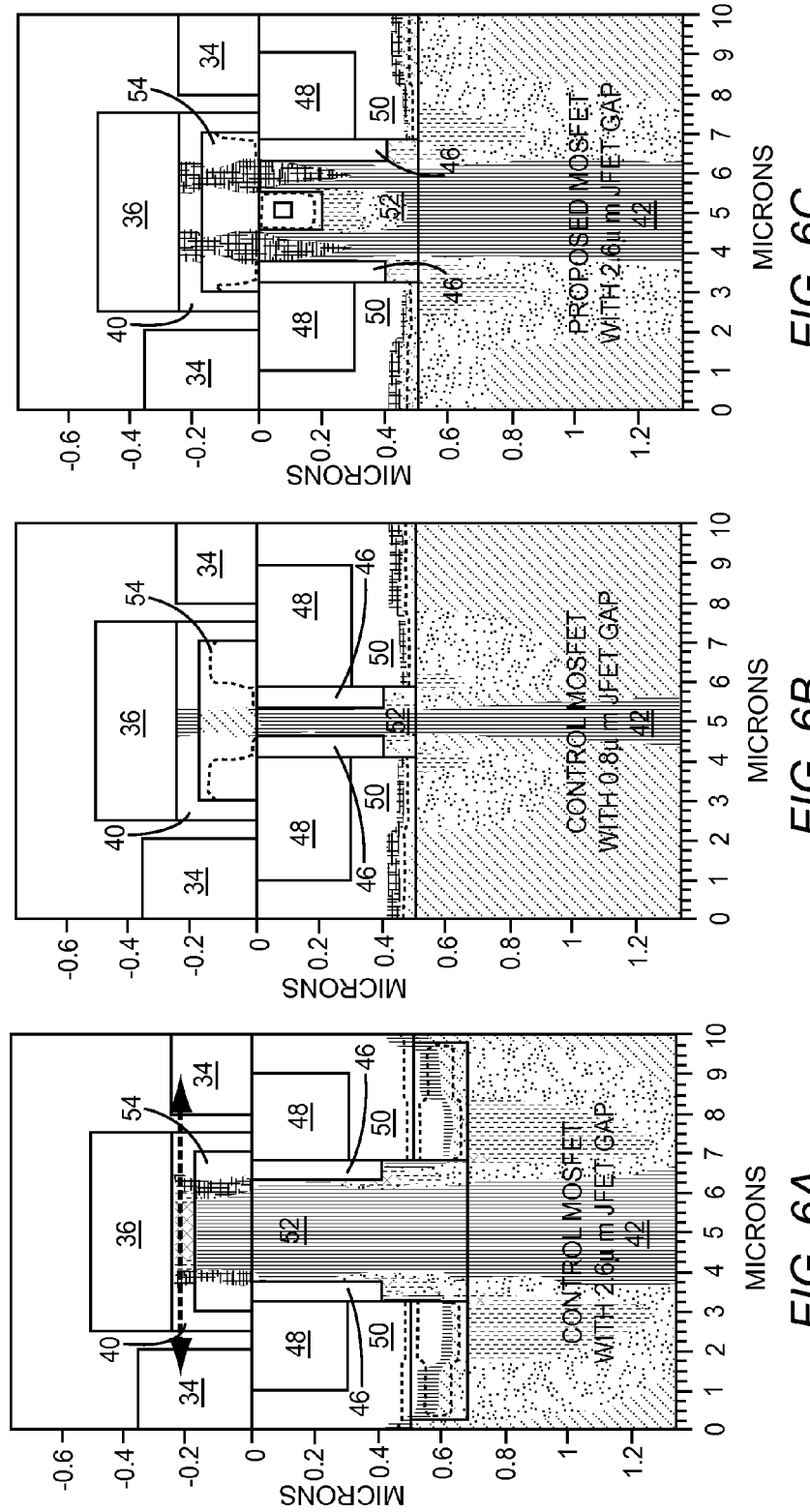
FIG. 6A is a graphic illustrating an electrical field distribution for a conventional MOSFET having a standard JFET gap of 2.6 microns at a blocking voltage of 960 Volts.
FIG. 6B is a graphic illustrating an electrical field distribution for a conventional MOSFET having a narrowed JFET gap of 0.8 microns at a blocking voltage of 960 Volts.
Figure 7:
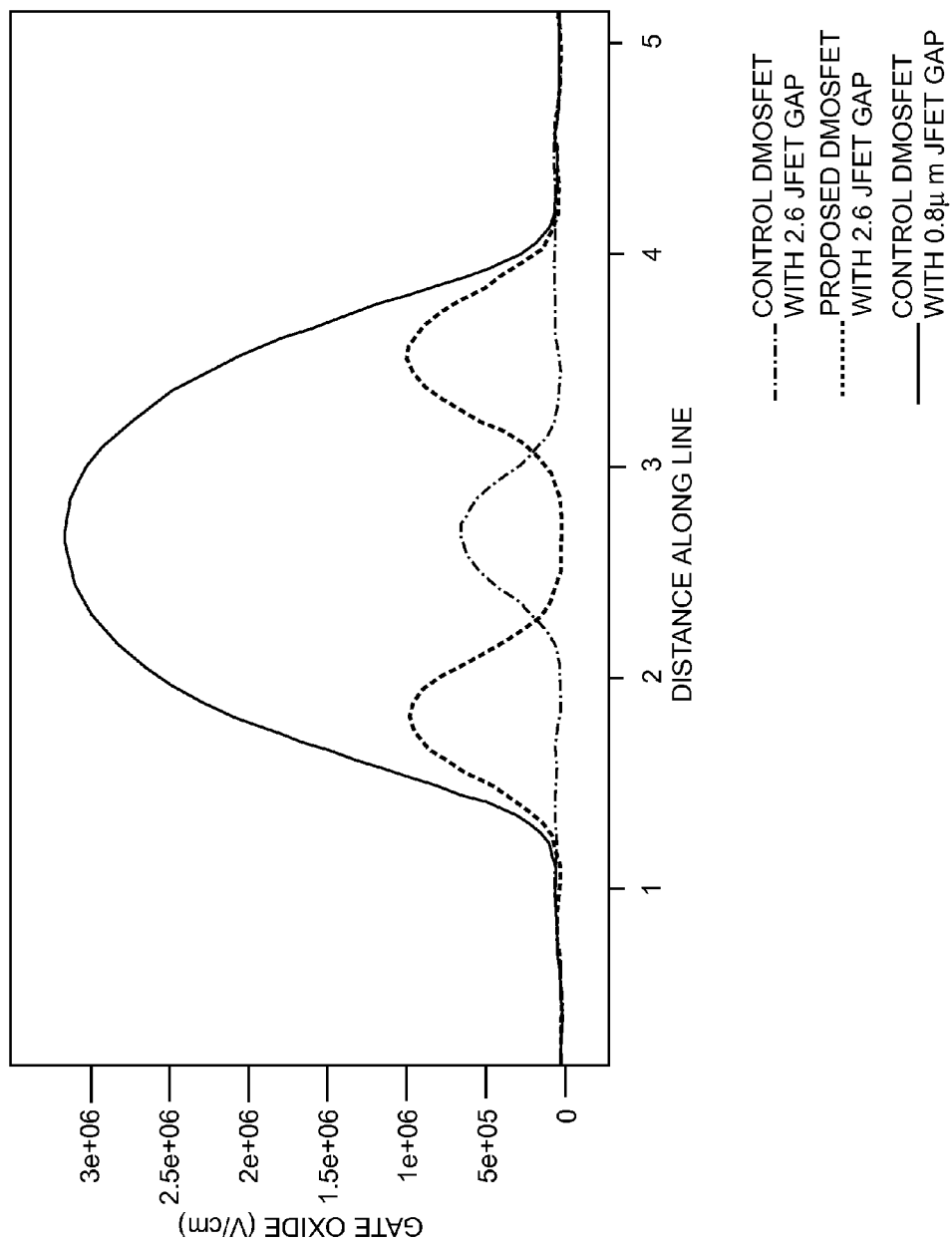

FIG. 6C is a graphic illustrating an electrical field distribution for a MOSFET having a P+ region introduced within the JFET region of the transistor device according to one embodiment and having a standard JFET gap of 2.6 microns at a blocking voltage of 960 Volts; and FIG. 7 is a graphic of the electric field distributions on top of the gate oxide at the center of the gate oxide for the various MOSFETs shown in FIGS. 4A-4C, which illustrates a significant electrical field reduction has been achieved by the transistor structure having a P+ region introduced within the JFET region of the transistor device without sacrificing on-state resistance.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

There is a need for a MOSFET structure that has reduced electrical field at the gate oxide interface, thus resulting in improved device reliability. One approach at addressing this issue is to narrow the JFET gap. However, it has been recognized by the inventors of the present invention that narrowing down the JFET gap (without sacrificing forward voltage drop) on a conventional MOSFET device could improve the device reliability under high electrical field stressing, but it may not eliminate failure.

The disclosure relates to a transistor device that has a new structure in order to reduce an electrical field at a gate oxide interface and significantly reduce or eliminate failure or reliability issues under long-term blocking operation, in which the drain is placed under a high positive bias. In one preferred embodiment, the transistor device is a MOSFET device and even more preferably a Silicon Carbide (SiC) MOSFET device. However, the transistor device may more generally be any type of device having a transistor (e.g., a power MOSFET; a double differentiated field effect transistor (DMOSFET); a trench gated metal oxide semiconductor field effect transistor (UMOSFET); an insulated gate bipolar transistor (IGBT); and the like).

In one embodiment, a transistor device having a reduced electrical field at the gate oxide is disclosed. The transistor device comprises a gate, a source, and a drain, wherein the gate is at least partially atop a gate oxide layer. The transistor device has at least one P+ region within a JFET region of the transistor device in order to reduce an electrical field on the gate oxide. Due to the presence of material defects that may occur in the transistor device, a high electrical field in the gate oxide may be enhanced at or around the defective points. Reducing the electrical field can significantly reduce the role of the defects on the reliability of the transistor device, particularly during long-term blocking operation, in which the drain is placed under a high positive bias. In silicon carbide MOSFETs, it may be desirable to reduce the gate field to less than one (1) MV/cm at a rated voltage to ensure reliability.

In another embodiment, the transistor device has a gate, a source, and a drain and comprises a first epitaxial layer of a first conductivity type, a second epitaxial layer of a second conductivity type on the first epitaxial layer, and a buried channel layer adjacent a first surface of the transistor device. The buried channel layer extends across a portion of the second epitaxial layer and is at least partially covered with a gate oxide layer. The transistor device also includes a well region of the first conductivity type extending from the first epitaxial layer down into the body of the transistor device to a depth, a JFET region adjacent the well region, and a drift layer below the well region.

A separate region of the first conductivity type, which may be a P+ region in one embodiment, is introduced within the JFET region of the device. In one embodiment, the P+ region is introduced substantially in the middle of the JFET region and is connected to a source, which effectively shields the electrical field from the drain side of the device. The P+ region introduced within the JFET region may also be shallower than the P+ well regions, which also mitigates the current spreading resistance.

Before specifically describing various embodiments of the present disclosure, a discussion is provided of research conducted by the inventors that will enable better understanding of the transistor devices disclosed herein.

Figure 1:
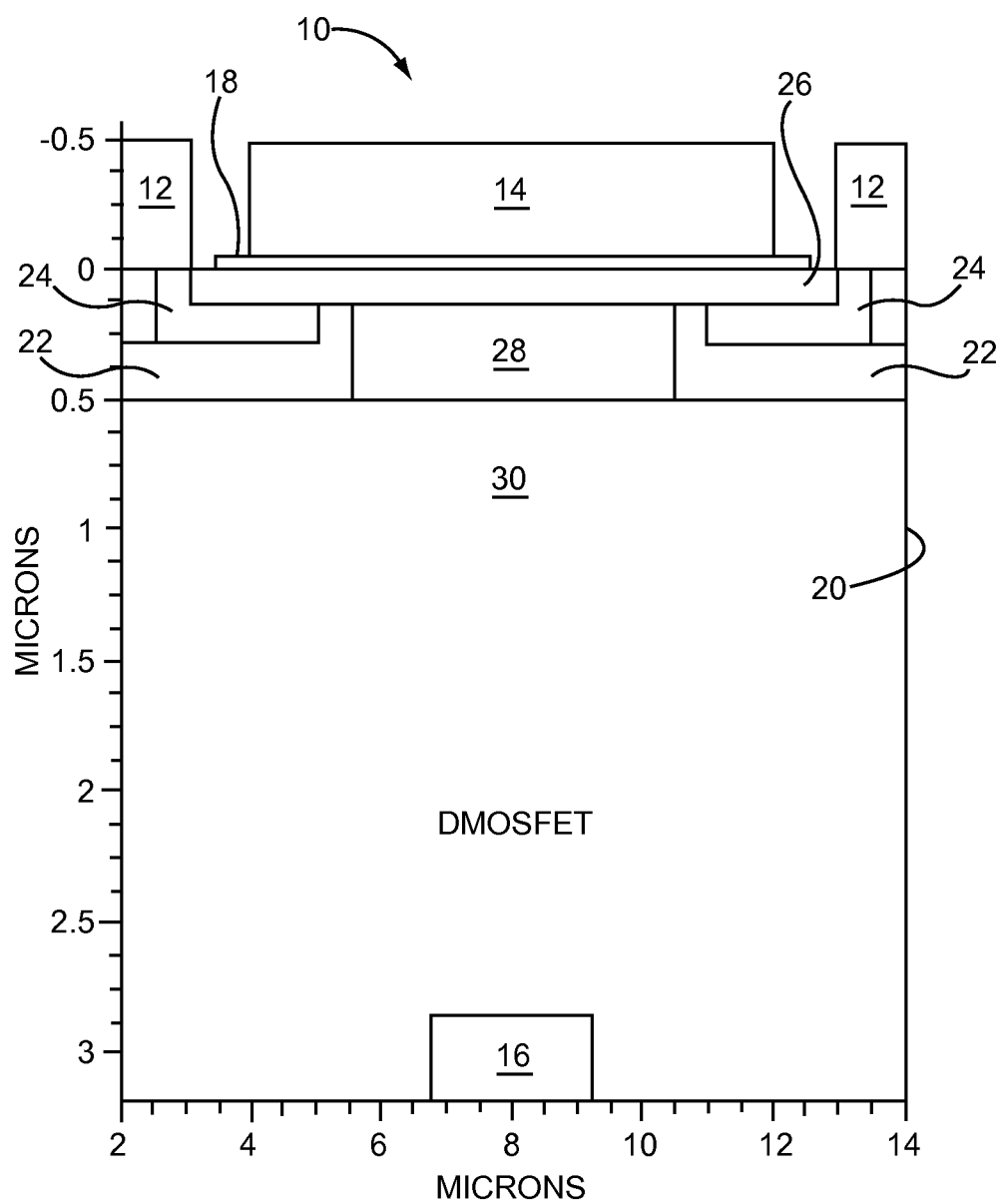
FIG. 1 is a double implanted field effect transistor (DI-MOSFET) having a buried channel.

FIG. 1 illustrates a MOSFET device 10 that does not have reduced electrical field at the gate oxide interface. In FIG. 1, the MOSFET device 10 is a traditional DMOSFET. The traditional DMOSFET 10 includes a source 12, a gate 14, and a drain 16 positioned on a semiconductor body 20 with the gate 14 atop an oxide layer 18 insulating the gate region. The DMOSFET 10 includes a P+-type well 22 implanted into the semiconductor body 20 to a depth of about 0.5 microns and doped to an appropriate level, such as between about $5 \times 10^{18}$ cm$^{-3}$ and $5 \times 10^{20}$ cm$^{-3}$ in one embodiment, although other dopant levels could be used. An N+ source region 24 doped to an appropriate level, such as approximately $5 \times 10^{19}$ cm$^{-3}$ in one embodiment, although other dopant levels could be used. The N+ source region 24 is adjacent the P+-type well 22 and positioned between the P+-type well 22 and a buried channel 26. The buried channel 26 extends across portions of the source region 24, the P+-type well 22 and the semiconductor body 20 between active regions, i.e., a JFET region 28.

A JFET region 28 generally is an active portion of an N-type drift layer which may include an N-type dopant and is located between two P-type wells, such as P+-type well 22. The JFET region in general may refer to a region in contact with channel regions coming up to the surfaces of the P-type wells by applying a gate voltage. The JFET region 28 makes up a conduction path for electrons with the N+ source region 24, the channel region 26, an N-type drift region 30, a substrate, and the drain electrode 16. The JFET region 28 may be provided by epitaxial growth or by implantation. In certain embodiments, the JFET region 28 may have a thickness ranging from about 0.5 microns to about 1.5 microns. The buried channel 26, the JFET region 28, and a supporting drift region 30 of the DMOSFET 10 may be doped to appropriate levels. In one embodiment, the buried channel 26 may be doped between about $1 \times 10^{16}$ cm$^{-3}$ and $1 \times 10^{17}$ cm$^{-3}$, the JFET region 28 may be doped between about $2 \times 10^{16}$ cm$^{-3}$ and $5 \times 10^{16}$ cm$^{-3}$, and the supporting drift region 30 may be doped between about $2 \times 10^{14}$ cm$^{-3}$ and $5 \times 10^{16}$ cm$^{-3}$, although other dopant levels could be used.

In a typical DMOSFET, the fabrication process controls the channel surface by using ion implantation instead of doping during layer growth. Ion implantation is difficult to achieve accurately in DMOSFETs, and the resulting devices are limited in channel mobility. In addition, the traditional DMOSFET 10 shown in FIG. 1 may have a high electrical field at the gate oxide in the center of JFET region 28 of the device.

The high electrical field combined with any imperfections in the interface material and gate oxide could result in a gate oxide failure under long-term blocking operation, in which the drain is placed under a high positive bias. Also, the traditional DMOSFET 10 shown in FIG. 1 may suffer from possible hot carrier injection during long-term blocking operation, in which the drain is placed under a high positive bias.

Figure 2:
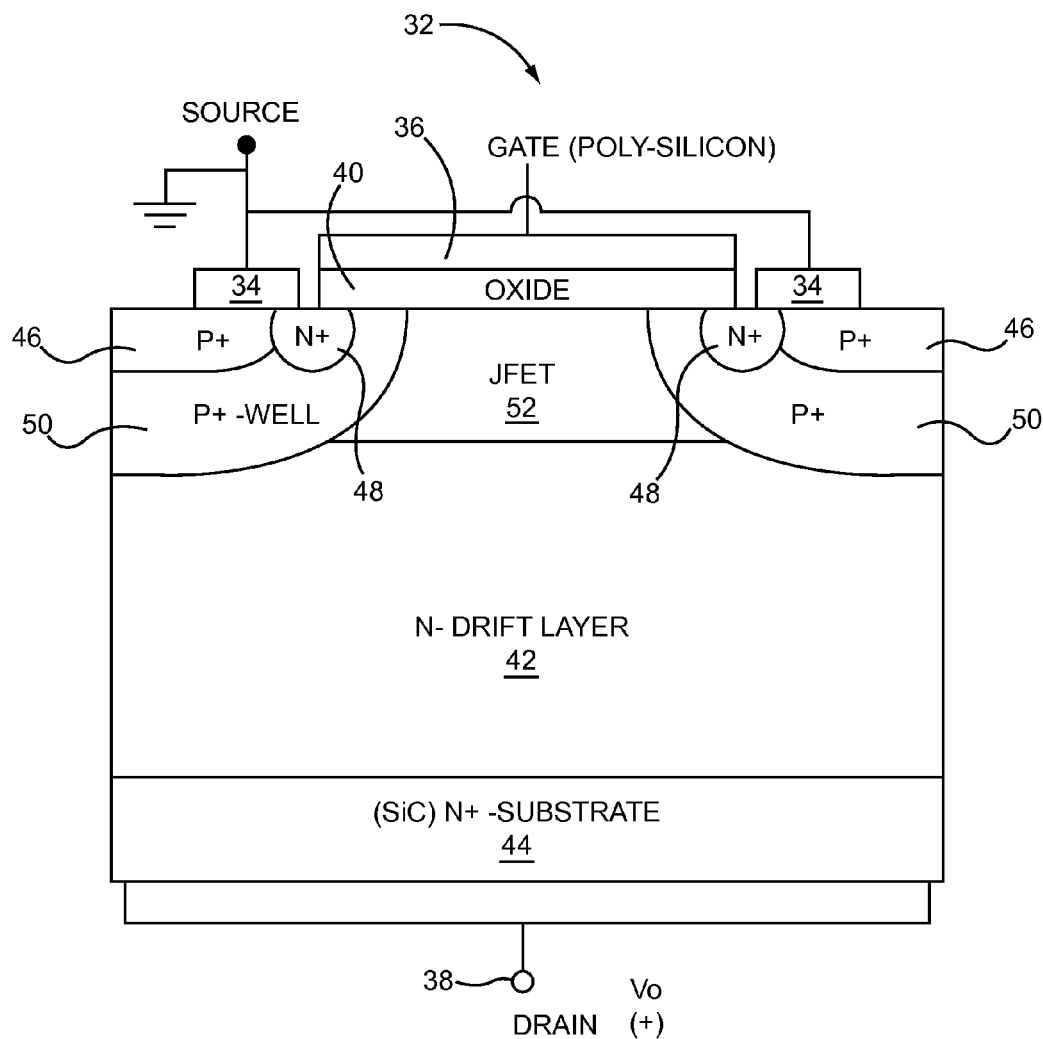
FIG. 2 is another embodiment of a standard MOSFET cell that does not have reduced electrical field at the gate oxide interface.

FIG. 2 shows another embodiment of a standard DMOSFET cell that does not have reduced electrical field at the gate oxide interface. In FIG. 2, a DMOSFET 32 includes a source 34, a gate contact 36, and a drain 38 positioned on a body of the DMOSFET with the gate contact 36 atop an oxide layer 40 insulating the gate region. The DMOSFET 32 may have a supporting N-drift layer 42 and a N+-substrate 44, which in one embodiment may be a silicon carbide substrate. The DMOSFET 32 may also include at least one P+ region(s) 46 and at least one N+ region(s) 48. The DMOSFET also includes at least one P+-type well region 50 implanted into the body of the DMOSFET 32 having at least one P+ region 46. The at least one N+ source region 48 may be doped to an appropriate level (such as approximately $5 \times 10^{19}$ cm$^{-3}$ in one embodiment) and is adjacent the at least one P+ region 46. A JFET region 52 is located underneath the oxide layer 40 and is doped to appropriate levels, such as between about $2\times10^{16}$ cm$^{-3}$ and $5\times10^{16}$ cm$^{-3}$ in one embodiment. The supporting drift region 52 of the DMOSFET 32 may also be doped to appropriate levels (such as between about $2\times10^{14}$ cm$^{-3}$ and $5\times10^{16}$ cm$^{-3}$ in one embodiment) and is supported by a substrate 44 (which may be any made of any material, but may be a N+ silicon carbide substrate in one embodiment) down to the drain 38.

In a typical related art DMOSFET, the fabrication process controls the channel surface by using ion implantation instead of doping during layer growth. Ion implantation is difficult to achieve accurately in DMOSFETs, and the resulting devices are limited in channel mobility. In addition, the DMOSFET 32 shown in FIG. 2 also may have a high electrical field at the gate oxide in the center of the JFET region 52 of the device. The high electrical field combined with any imperfections in the interface material and gate oxide could result in a gate oxide failure under long-term blocking operation, in which the drain is placed under a high positive bias. Also, the DMOSFET 32 shown in FIG. 2 may suffer from possible hot carrier injection during long-term blocking operation, in which the drain is placed under a high positive bias.

The related art MOSFET devices in FIGS. 1 and 2 illustrate the common need for modifications to transistor design that reduces the electrical field at the gate oxide interface and increases maximum current flow in the on state with the ability to block incident voltages in reverse biased operation. For illustrative purposes, assume that the substrate and the drift layer of the devices shown in FIGS. 1-3 are each formed of Silicon Carbide (SiC). However, other semiconductor materials may be used.

One approach at addressing high electrical field at the gate oxide interface is to narrow the JFET gap. However, it has been recognized by the inventors of the present invention that narrowing down the JFET gap (without sacrificing forward voltage drop) on a conventional MOSFET device could improve the device reliability during long-term blocking operation, in which the drain is placed under a high positive bias, but it may not eliminate failure.

In order to reduce the electrical field at the gate oxide interface and eliminate failure during long-term blocking operation, in which the drain is placed under a high positive bias, a new transistor structure is proposed. At least one separate P+ region is introduced within the JFET region. In one embodiment, the at least one P+ region is introduced substantially in the middle of the JFET region and is connected to the source, which effectively shields the electrical field from the drain side of the device. The at least one P+ region introduced within the JFET region may also be shallower than the P+ well regions, which also mitigates the current spreading resistance.

Figure 3A:
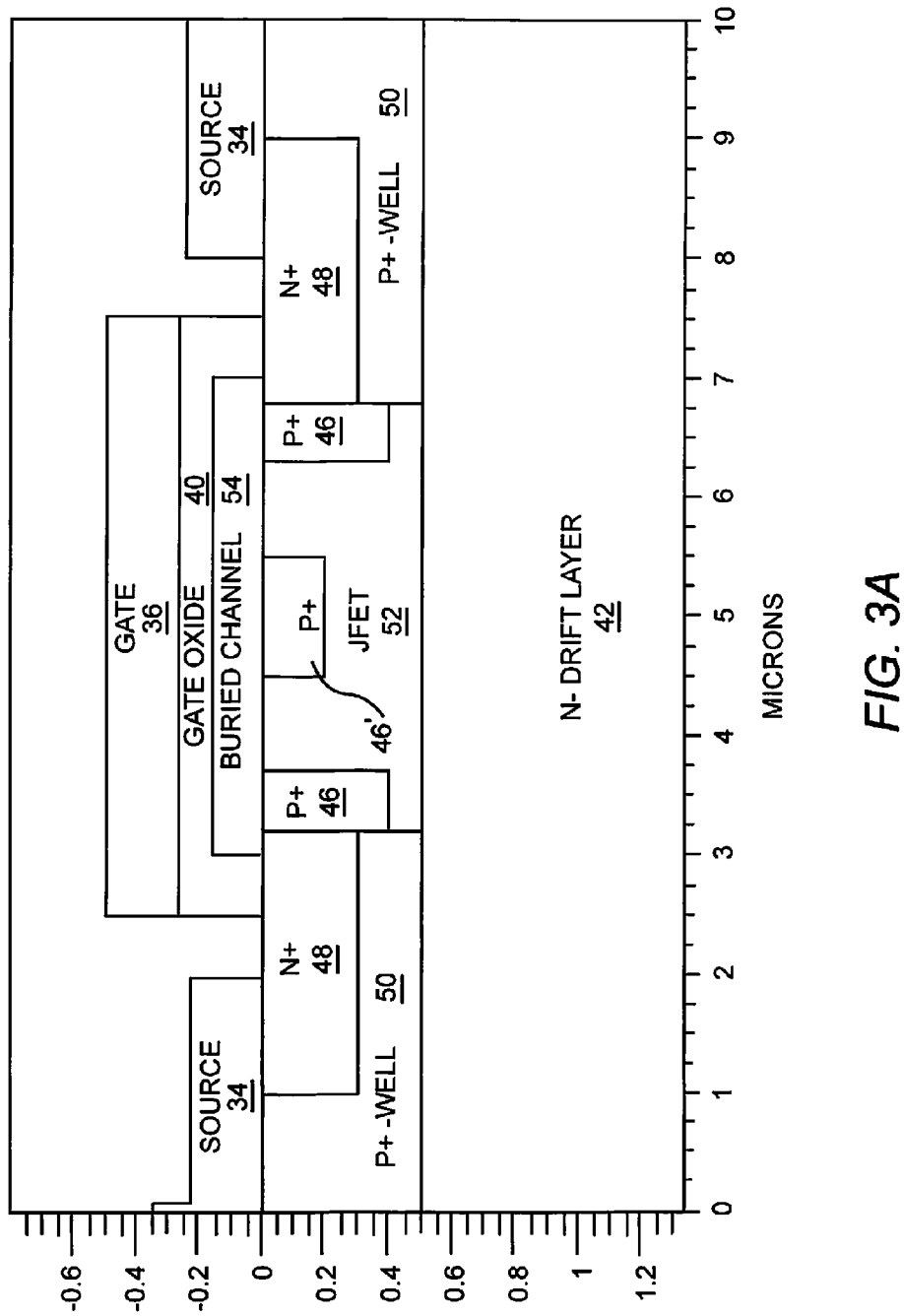
FIG. 3A illustrates a transistor device having a new structure that includes a P+ region introduced within the JFET region of the transistor device according to one embodiment.

Referring now to FIG. 3A, a proposed new structure is shown. FIG. 3A illustrates a device that has reduced electrical field at the gate oxide interface due to the introduction of at least one P+ region in the JFET region. Although shown in FIG. 3A as having a square or rectangular shape, the at least one P+ region introduced in the JFET region may be any shape. In addition, the P+ region(s) introduced in the JFET region may be flush with the surface of the JFET region or the P+ region(s) may be below a top surface of the JFET region.

In FIG. 3A, the device is a DMOSFET, but the device could be any type of device having a source, a gate, a gate oxide layer, a P+ well, and a JFET region, including but not limited to MOSFETs, UMOSFETs, IGBTs, and the like. Like the traditional DMOSFET shown in FIG. 1, the new structure includes a source 34 and a gate contact 36 with the gate contact 36 atop an oxide layer 40 insulating the gate region. The device includes a P+-type well 50 implanted into the device to a depth of about 0.5 microns and doped to an appropriate level, such as between about $5\times10^{18}$ cm$^{-3}$ and $5\times10^{20}$ cm$^{-3}$ in one embodiment, although other dopant levels could be used. An N+ source region 48 is doped to an appropriate level (such as approximately $5\times10^{19}$ cm$^{-3}$ in one embodiment, although other dopant levels could be used) and is adjacent the P+ well 50 and positioned between the P+-type well 50 and a buried channel 54. The buried channel 54 may extend across portions of the device between active regions, i.e., a JFET region 52.

A JFET region like JFET region 52 generally is an active portion of an N-type drift layer which may include an N-type dopant and is located between two P-type wells or inside a P+-type well, such as P+-type well 50. The JFET region in general may refer to a region in contact with channel regions coming up to the surfaces of the P-type wells by applying a gate voltage. The JFET region 52 makes up a conduction path for electrons with the N+ source region 48, the channel region 54, an N-type drift region 42, a substrate, and the drain (not shown in FIG. 3A). The JFET region 52 may be provided by epitaxial growth or by implantation. In certain embodiments, the JFET region 52 may have a thickness ranging from about 0.5 microns to about 1.5 microns.

The buried channel 54, the JFET region 52, and supporting drift region 42 of the device may be doped to appropriate levels. In one embodiment, the buried channel 54 may be doped between about $1\times10^{16}$ cm$^{-3}$ and $1\times10^{17}$ cm$^{-3}$, the JFET region 52 may be doped between about $1\times10^{16}$ cm$^{-3}$ and $5\times10^{17}$ cm$^{-3}$, and the supporting drift region 42 may be doped between about $1\times10^{14}$ cm$^{-3}$ and $5\times10^{16}$ cm$^{-3}$, although other dopant levels could be used.

In the new proposed device, at least one separate P+ region 46', such as a separate P+ region 46', is introduced within the JFET region 52, as shown in FIG. 3A. Although shown in FIG. 3A as having a square or rectangular shape, the at least one separate P+ region 46' introduced in the JFET region 52 may be any shape. In addition, the at least one separate P+ region(s) 46' introduced in the JFET region 52 may be flush with the surface of the JFET region 52 or the at least one separate P+ region(s) 46' may be below a top surface of the JFET region 52. In one embodiment, the separate P+ region 46' may be formed by implanting aluminum with a doping equal to or greater than approximately $1\times10^{18}$ cm$^{-3}$ in one embodiment, the separate P+ region 46' is introduced substantially in the middle of the JFET region 52 and is connected to the source 34, which effectively shields the electrical field from the drain side of the device. The separate P+ region 46 introduced within the JFET region 52 may also be shallower than the P+-type well regions 50, which also mitigates the current spreading resistance.

In one embodiment, the separate P+ region 46' is approximately 0.2 microns deep into the device, though other depths may be used. In addition, in one embodiment, the separate P+ region 46' introduced within the JFET region 52 may be between 0.5 and 1.0 microns wide, though other widths are possible. As shown in FIG. 3, the separate P+ region 46' may have a ohmic contact used for simulation purposes only (shown by the box in the separate P+ region 46'). In operation, the separate P+ region 46' is shorted to the source 34.

Figure 3B:
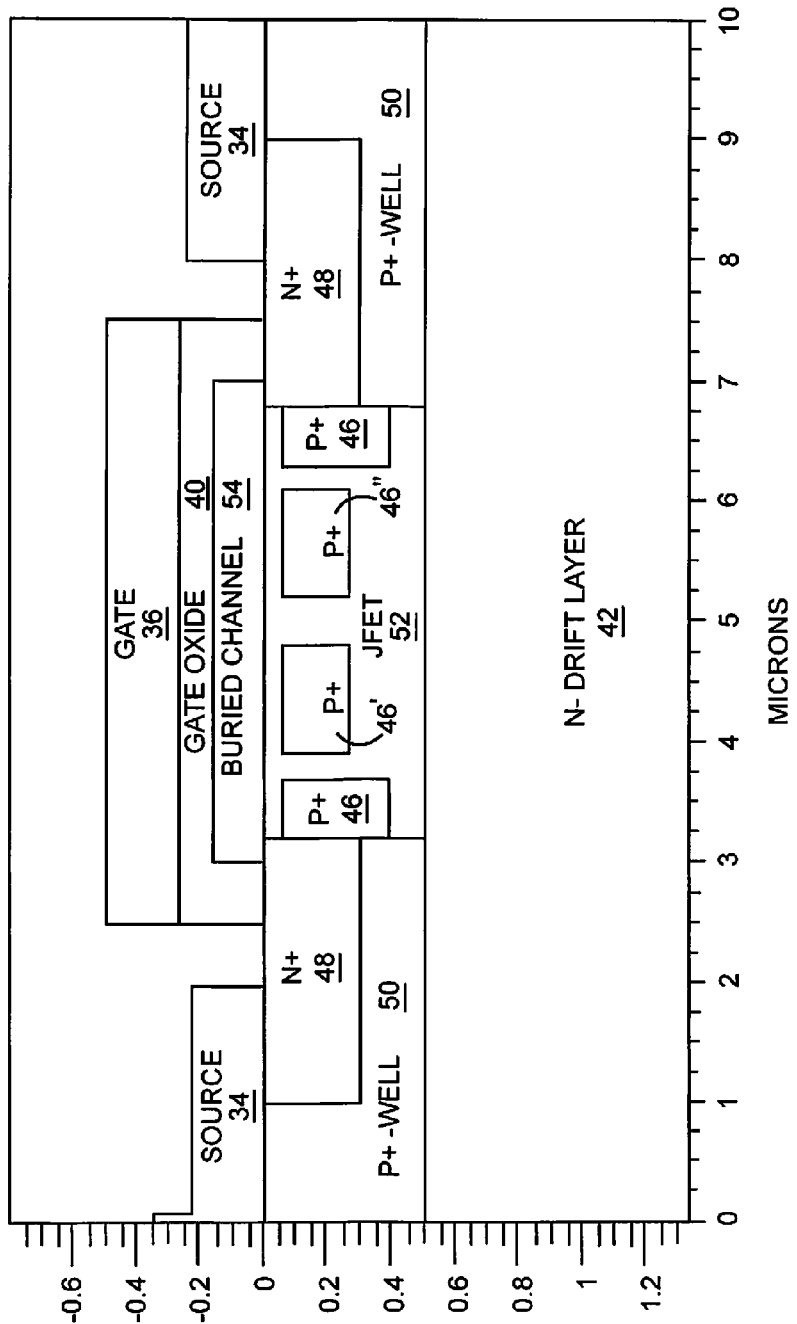
FIG. 3B illustrates an alternate transistor device having a new structure that includes a plurality of P+ regions introduced within the JFET region of the transistor device according to one embodiment.

FIG. 3B illustrates an alternate transistor device having a new structure that includes a plurality of P+ regions 46' and 46" introduced within the JFET region 52. In FIG. 3B, there are two P+ regions (46' and 46") introduced within the JFET region 52, although any number of P+ regions 46' and 46" may be introduced within the JFET region 52. In various embodiments, the P+ regions 46' and 46" can have various shapes and different implant profiles below a top surface of the JFET region 52. In the embodiment of FIG. 3B, the P+ regions 46' and 46" are below a top surface of the JFET region 52. In particular, in one embodiment, one or more of the P+ regions 46' and 46" can be retrograde to the top surface of the JFET region 52 to reduce the implant damage to the MOS interface, as long as the P+ region 46' or 46" is shorted to the source 34.

FIGS. 4A-4C show forward current conduction distributions of various devices. FIG. 4A shows the forward current conduction distribution for a conventional control MOSFET having a typical JFET gap of approximately 2.6 microns. FIG. 4B shows the forward current conduction distribution for a control MOSFET having a narrowed JFET gap of approximately 0.8 microns. As can be seen in FIG. 4B, the MOSFET with the narrowed JFET gap significantly increases spreading resistance as compared to the conventional control MOSFET. This indicates that the MOSFET with the narrowed JFET gap creates a bottleneck at a narrow JFET region. FIG. 4C shows the forward current conduction distribution for a MOSFET having the proposed structure with a P+ region introduced within the JFET gap and a standard JFET gap of about 2.6 microns. As can be seen in FIG. 4C, the MOSFET having the proposed structure with a P+ region introduced within the JFET gap does not have the increased spreading resistance associated with the MOSFET having the narrowed JFET gap and is more in line with the traditional MOSFET having the standard JFET gap.

Figure 5:
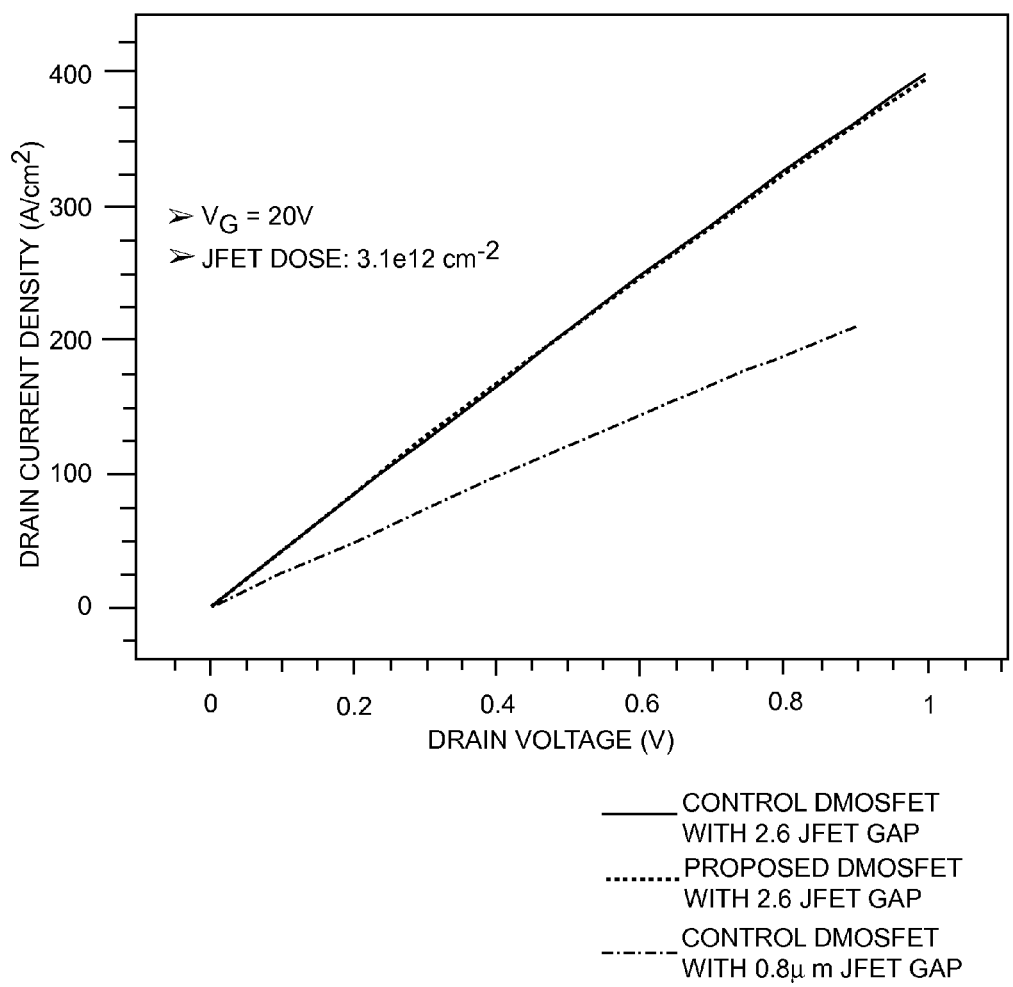
FIG. 5 is a graphical representation of the forward IV curves for the various MOSFETs shown in FIGS. 4A-4C, which illustrates that the proposed transistor structure having a P+ region introduced within the JFET region of the transistor device exhibits the same on-resistance as the conventional MOSFET with a standard JFET gap.

Further, as can be seen in FIG. 5, the proposed device having a P+ region introduced within the JFET gap also exhibits the same on-resistance as the conventional MOSFET with the standard JFET gap. FIG. 5 shows forward IV's as measured in drain voltage versus drain current density for each of the devices shown in FIGS. 4A-4C. As can be seen from FIG. 5, the MOSFET having the narrowed JFET gap has a lower on-resistance as compared to the conventional MOSFET with the standard JFET gap, while the proposed device having a P+ region introduced within the JFET gap also exhibits the same on-resistance as the conventional MOSFET with the standard JFET gap.

FIGS. 6A-6C illustrate the electrical field contours of the devices shown in FIGS. 4A-4C compared to G2 1200V control DMOSFETs. A drain voltage of 960 volts was used in these simulations. As seen in FIGS. 6A-6C, the proposed device having a P+ region introduced within the JFET gap results in reduced electrical field at the gate oxide interface (FIG. 6C) as compared to the conventional DMOSFET with a standard JFET gap.

This may also be seen in FIG. 7, which shows the electrical field distributions at the top of the gate oxide and at the center of the gate oxide. As seen in FIG. 7, significant electrical field reduction has been achieved on the proposed structure having a P+ region introduced within the JFET gap, all without sacrificing the on-resistance.

The proposed structure of FIG. 3 may be fabricated according to any of various standard techniques. Likewise, the P+ region 46' introduced within the JFET region 52 may be formed according to any of various standard techniques one embodiment of the present disclosure. Through the process, exemplary materials, doping types, doping levels, structure dimensions, and the selected alternatives are outlined, these aspects are merely illustrative, and the concepts disclosed herein and the claims that follow are not limited to these aspects.

The method of forming the improved transistor structure described herein enhances technology that has been advantageously used for DMOSFETs of the related art. The traditional methods, however, are modified to account for the fact that the transistor device includes a P+ region introduced within the JFET region of the transistor device. As noted above, MOSFETs according to this invention optionally include a silicon carbide substrate formed by known means. Referring back to FIGS. 2 and 3, a drift region layer 42 of 4H—SiC is epitaxially grown on a substrate 44. The method includes forming at least one doped well region 50 of a first conductivity type, preferably P+. The well region 50 can be formed by any common technique but is preferably formed by implanting dopants into the device from the top of the device down to a depth that is greater than one micron. A second layer 48 of a second conductivity type (such as N+ in one embodiment) is formed on the first layer 50. The body of the transistor device at this point includes semiconductor layers, preferably of silicon carbide, for controlling electrical conduction from top to bottom.

Structures 46, 48, 50, and 52 are formed primarily by ion implantation, and layer 54 is then grown on top by epitaxy. A buried channel layer 54 is formed by epitaxy, and the buried channel layer 54 is etched through selectively in areas that sit above the P+-type well 50 and the N+ source region 48 in order to make contact to those layers. Afterwards, the channel 54 is covered with a layer of gate insulation (gate oxide 40), such as silicon dioxide, on which the gate contact 36 is formed. A region of the first conductivity type is then introduced into the JFET region according to any known methods. In one embodiment, the region of the first conductivity type is a P+ region. Source and drain contacts 34 and 38, common in these types of transistors, complete the transistor device.

The method described herein can also be used to form other transistors that include a P+ region introduced into the JFET region to reduce the electrical field at the gate oxide interface. Accordingly, this invention is not limited to various MOSFETs, but is equally applicable to insulated gate bipolar transistors and metal-oxide-semiconductor controlled thyristors. The semiconductor material used for forming all of these devices is preferably silicon carbide, but the invention is not limited to such.

Those skilled in the art will recognize improvements and modifications to the preferred embodiments of the present disclosure. All such improvements and modifications are considered within the scope of the concepts disclosed herein and the claims that follow.

Examples of methods that may be used to form the structures disclosed herein include, but are not limited to the following: A method of forming a transistor device comprising providing a source and a gate, wherein the gate is at least partially in contact with a gate oxide; and providing a at least one P+ region within a junction field effect (JFET) region adjacent a P+-type well region, in order to reduce an electrical field on the gate oxide, wherein the at least one P+ region introduced within the JFET region reduces an electrical field at the gate oxide. In addition, in one embodiment, a body of the transistor device may comprise silicon carbide. In one embodiment, the method may comprise any of the above disclosed methods, wherein the at least one P+ region is provided substantially in the middle of the JFET region. In yet another embodiment, the method may comprise any of the above disclosed methods, further comprising connecting the at least one P+ region to the source. In one embodiment, the depth of the at least one P+ region is between about approximately 0.1 and about approximately 0.3 microns in depth, and the width of the at least one P+ region is between approximately 0.5 microns and approximately 1.0 microns in width. The disclosed methods may provide a width of the JFET region between about approximately 2.0 and about approximately 3.6 microns.

In addition to the above methods, a method of forming a transistor device may comprise providing a drift layer on a substrate; implanting a well region on the drift layer; providing a first epitaxial layer such that the first epitaxial layer covers at least a portion of the well region; providing a second epitaxial layer on the first epitaxial layer; providing a buried channel layer over a portion of the second epitaxial layer; providing a source and a gate, wherein the gate is at least partially In contact with a gate oxide; and providing a at least one P+ region within a junction field effect (JFET) region adjacent the well region.

In another embodiment, the at least one P+ region introduced within the JFET region reduces an electrical field at the gate oxide. In another embodiment, a body of the transistor device may comprise silicon carbide. In one embodiment, the at least one P+ region is provided substantially in the middle of the JFET region. In another embodiment, the method may comprise any method disclosed above, the method further comprising connecting the at least one P+ region to the source. In yet another embodiment, the method may comprise any of the disclosed methods, wherein the P+ region is shallower in depth than the well region. In one embodiment, the at least one P+ region is between about approximately 0.1 microns and about approximately 0.3 microns in depth. In another embodiment, the at least one P+ region is between approximately 0.5 microns and approximately 1.0 microns in width. In yet another embodiment, the width of the JFET region is between about approximately 2.0 and about approximately 3.6 microns.

In addition to the above methods, the method of forming a MOSFET may comprise: providing a P+-type epitaxial layer on a drift layer; providing an N+-type region on the P+-type epitaxial layer; providing a buried channel layer adjacent a first surface of the MOSFET, the buried channel layer extending across a portion of the N+-type region; forming a P+-type well extending from the P+-type epitaxial layer down into the body of the MOSFET to a depth; providing a source and a gate, wherein the gate is at least partially in contact with a gate oxide; and providing a P+ region within a junction field effect (JFET) region adjacent the P+-type well region in order to reduce an electrical field on the gate oxide. In one embodiment, the at least one P+ region introduced within the JFET region reduces an electrical field at the gate oxide. In another embodiment, a body of the MOSFET may comprise silicon carbide. In yet another embodiment, the at least one P+ region is provided substantially in the middle of the JFET region. The method of forming a MOSFET may comprise connecting the at least one P+ region to the source. In one embodiment, the at least one P+ region is shallower in depth than the P+ well region. In another embodiment, the at least one P+ region is between about approximately 0.1 microns to about approximately 0.3 microns in depth. In yet another embodiment, the at least one P+ region is between approximately 0.5 microns and about approximately 1.0 microns in width. In another embodiment, the width of the JFET region is between about approximately 2.0 and about approximately 3.6 microns.

What is claimed is:

1. A transistor device having a gate that is at least partially in contact with a gate oxide, a source, and a drain, the transistor device comprising:
   a well region of a first conductivity type;
   a region of a second conductivity type on the well region;
   a buried channel layer adjacent a first surface of the transistor device, the buried channel layer extending across a portion of the region of the second conductivity type and being at least partially covered by the gate oxide where the transistor device has a reduced electrical field on the gate oxide;
   a junction field effect (JFET) region adjacent the well region;
   a drift layer below the well region;
   a region of the first conductivity type at the JFET region and adjacent the well region and the region of the second conductivity type, wherein the JFET region extends between the region of the first conductivity type and the buried channel layer; and
   first and second regions of the first conductivity type introduced at the JFET region, wherein the well region is implanted to a first depth within the transistor device and at least one of the first and second regions is implanted at a second depth within the JFET region that is between half the first depth and the first depth of the well region.

2. A transistor device according to claim 1, wherein the first and second regions of the first conductivity type introduced at the JFET region reduces an electrical field at the gate oxide.

3. A transistor device according to claim 1, wherein the transistor device is an MOSFET.

4. A transistor device according to claim 1, wherein the transistor device is an insulated gate bipolar transistor.

5. A transistor device according to claim 1, wherein the first conductivity type is P+, and the second conductivity type is N+.

6. A transistor device according to claim 1, wherein a body of the transistor device comprises silicon carbide.

7. A transistor device according to claim 1, wherein one of the first and second regions of the first conductivity type introduced at the JFET region is a P+ region and is introduced substantially in the middle of the JFET region.

8. A transistor device according to claim 1, wherein one of the first and second regions of the first conductivity type introduced at the JFET region is a P+ region and is connected to the source, which effectively shields the electrical field from a side of the transistor device having the drain.

9. A transistor device according to claim 1, wherein one of the first and second regions of the first conductivity type introduced within the JFET region is a P+ region and is shallower in depth than the well region.

10. A transistor device according to claim 1, wherein one of the first and second regions of the first conductivity type introduced within the JFET region is a P+ region and is between about approximately 0.1 microns and about approximately 0.3 microns in depth.

11. A transistor device according to claim 1, wherein one of the first and second regions of the first conductivity type introduced within the JFET region is a P+ region and is between about approximately 0.5 microns and about approximately 1.0 microns in width.

12. A transistor device according to claim 1, wherein a width of the JFET region is between about approximately 2.0 and about approximately 3.6 microns.

13. A transistor device according to claim 1, wherein the at least one of the first and second regions has a top portion that does not extend to the buried channel.

14. A MOSFET having a gate, a source, and a drain, wherein the gate is at least partially in contact with a gate oxide, the MOSFET comprising:
- a P+-type well implanted to a first depth within the MOSFET;
- an N+-type region on the P+-type well;
- a buried channel layer adjacent a first surface of the MOSFET, the buried channel layer extending across a portion of the N+-type region;
- a junction field effect (JFET) region adjacent the P+ type well;
- a first P+ region at the JFET region and adjacent the well region and the N+ type region, wherein the JFET region extends between the first P+ region and the buried channel layer;
- a second P+ region at the JFET region in order to reduce an electrical field on the gate oxide, wherein the second P+ region is at a second depth between half the first depth and the first depth of the P+-type well.

15. A MOSFET according to claim 14, wherein a body of the MOSFET comprises silicon carbide.

16. A MOSFET according to claim 14, wherein the second P+ region is substantially in the middle of the JFET region.

17. A MOSFET according to claim 14, wherein the second P+ region is connected to the source, which effectively shields the electrical field from a side of the MOSFET having the drain.

18. A MOSFET according to claim 14, wherein the second P+ region is between about approximately 0.1 and about approximately 0.3 microns in depth.

19. A MOSFET according to claim 14, wherein the second P+ region is between about approximately 0.5 microns and about approximately 1.0 microns in width.

20. A MOSFET according to claim 14, wherein a width of the JFET region is between about approximately 2.0 and about approximately 3.6 microns.

21. A MOSFET according to the claim 14, further comprising a third P+ region.

22. A MOSFET according to claim 21, wherein one of the second P+ region and the third P+ region is shallower in depth than the P+ well.

23. A MOSFET according to the claim 14, wherein the second P+ region has a top portion that does not extend to the buried channel layer.

* * * * *